(12) United States Patent
Sforzin et al.

(10) Patent No.: US 7,352,645 B2
(45) Date of Patent: Apr. 1, 2008

(54) MEMORY DEVICE

(75) Inventors: Marco Sforzin, Cantu' (IT); Emanuele Confalonieri, Milan (IT); Nicola Del Gatto, Torre Del Greco (IT); Carla Giuseppina Poidomani, Cassina De' Pecchi (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 13 days.

(21) Appl. No.: 11/250,176

(22) Filed: Oct. 13, 2005

(65) Prior Publication Data

US 2006/0083078 A1 Apr. 20, 2006

(30) Foreign Application Priority Data

Oct. 15, 2004 (IT) .............................. MI04A1957

(51) Int. Cl.
*G11C 7/00* (2006.01)

(52) U.S. Cl. .................. 365/227; 365/189.06; 365/204

(58) Field of Classification Search .......... 365/189.06, 365/204
See application file for complete search history.

(56) References Cited

U.S. PATENT DOCUMENTS

| 5,216,630 | A | * | 6/1993 | Nakase | 365/155 |
|---|---|---|---|---|---|
| 5,396,452 | A | * | 3/1995 | Wahlstrom | 365/149 |
| 5,453,955 | A | * | 9/1995 | Sakui et al. | 365/203 |
| 5,814,853 | A | | 9/1998 | Chen | 257/315 |
| 5,933,373 | A | * | 8/1999 | Takahashi | 365/189.06 |
| 6,175,523 | B1 | | 1/2001 | Yang et al. | 365/185.25 |
| 6,240,020 | B1 | | 5/2001 | Yang et al. | 365/185.25 |
| 6,414,875 | B2 | | 7/2002 | Rolandi | 365/185.17 |
| 6,717,839 | B1 | | 4/2004 | Du | 365/145 |
| 2002/0036914 | A1 | | 3/2002 | Hayashi | 365/104 |
| 2003/0026145 | A1 | | 2/2003 | Lee | 365/200 |
| 2003/0043628 | A1 | | 3/2003 | Lee | 365/185.17 |
| 2003/0161183 | A1 | | 8/2003 | Tran | 365/185.03 |
| 2003/0210581 | A1 | | 11/2003 | Lee et al. | 365/200 |
| 2003/0227811 | A1 | | 12/2003 | Sugiura et al. | 365/222 |
| 2004/0085831 | A1 | | 5/2004 | Cho et al. | 365/200 |
| 2006/0146587 | A1 | * | 7/2006 | Chang et al. | 365/94 |

\* cited by examiner

*Primary Examiner*—Tan T. Nguyen
(74) *Attorney, Agent, or Firm*—Lisa K. Jorgenson; Robert Iannucci; Seed IP Law Group PLLC (57) ABSTRACT

A semiconductor memory device is provided. The semiconductor memory device includes a memory matrix having a plurality of memory cells arranged according to a plurality of rows and a plurality of columns and a plurality of bit lines, each bit line being associated with at least one respective column of said plurality. The semiconductor memory device further includes a bit line selection structure for selecting at least one among said bit lines and a voltage clamping circuit structure adapted to cause the clamping at a prescribed voltage of unselected bit lines adjacent and capacitively coupled to a selected bit line during a read operation.

24 Claims, 5 Drawing Sheets

MEMORY DEVICE

BACKGROUND OF THE INVENTION

1. Field of the Invention

The present invention relates to the data storage field in general; more specifically, the present invention relates to a semiconductor memory device, particularly albeit not limitatively to a non-volatile semiconductor memory.

2. Description of the Related Art

Non-volatile memory devices are commonly used to store information which must be preserved also in absence of an electric power source that supply the memory device. A particular class of non-volatile memory devices is electrically programmable; for example, flash $E^2PROM$ belong to such class. Typically, a flash memory includes a matrix of memory cells, each consisting of a floating gate MOS transistor programmed by injecting an electric charge into its floating gate; on the contrary, the transistor is erased by removing the electric charge from its floating gate. The electric charge in the floating gate of the transistor modifies its threshold voltage, in such a way as to define different logic values. Typically, the matrix of memory cells is partitioned in different sectors, which can be individually erased.

The memory device further includes a bit line for each column of the matrix, and a word line for each matrix row. The generic cell is positioned at the crossing of the bit line and the word line to which the cell belongs to. Using a so-called NOR memory architecture, the MOS transistors forming the cells of a same column are connected (by their drain terminal) to the respective bit line, and are connected in parallel to each other.

A read operation of the memory cells provides for biasing them in prescribed read operating conditions, and detecting the current that the memory cells sink. Particularly, during a reading phase of flash memory cells, it is necessary to bias the drain terminal of the cell at a reading voltage VD, typically 1V. This voltage is provided to the generic cell by means of the corresponding bit line. The bit lines are conductive lines photolithographically obtained from, e.g., a metal layer.

The unavoidable capacitive coupling between selected bit lines (accessed bit lines) and bit lines adjacent thereto (side bit lines) causes the generation of a current noise signal on the selected bit lines. This capacitive coupling is due to the fact that, owing to the ultra-large scale of integration, the distance (pitch) between adjacent bit lines in modern memory devices becomes smaller and smaller. Said current noise signal adds up to the reading current of the selected cell during its read operation. During the selected bit line charging (from a starting voltage substantially equal to the ground voltage to the reading voltage VD), the adjacent bit lines are capacitively brought towards a voltage value equal to a fraction of the voltage VD. Then, the side bit lines discharge in a way that depends on the programming state of the memory cells adjacent to the accessed memory cell (that is, the memory cells belonging to the same word line as the selected cell, and to the bit lines adjacent to the accessed bit line). In fact, if both of the immediately adjacent cells are programmed (high threshold voltage), and thus do not conduct current, the side bit lines do not discharge and remain at the voltage value reached during the charging phase. On the contrary, if one of the adjacent cells is not programmed (low threshold voltage), thereby conducting current (being connected to the selected word line), the bit line corresponding to the unprogrammed cell discharges toward ground. In short, both, only one, or none of the side bit lines may discharge toward ground, depending on the state of the memory cells adjacent to the selected one. Consequently, during the reading phase of a memory cell, a noise current Id is superimposed on the cell current Ic and this noise current Id depends on the adjacent memory cells state, so its value can not be forecasted in the design phase. In the case of so-called "multilevel" memory devices, whose memory cells can be programmed in more than two states, the current sunk by each memory cell has more than two possible values, so the noise current is even more variable.

In this way, the total current (I=Ic+Id) the sense amplifier receives at its input might determine the detection of an uncorrected value different from the one actually stored in the accessed cell. This problem of bit line capacitive coupling, also referred to as the "fringing" effect problem, is particularly critical when the current difference between different logic values that the cell reading current Ic may take, depending on the logic value stored therein, is small, as for example in the case of multilevel memory devices.

BRIEF SUMMARY OF THE INVENTION

In view of the state of the art outlined in the foregoing, the Applicant has faced the problem of how to avoid or at least reduce the problem of reading errors caused by fringing effects on the bit lines.

According to one embodiment of the present invention, a semiconductor memory device is provided. The semiconductor memory device, includes at least one memory matrix comprising a plurality of memory cells, arranged according to a plurality of rows and a plurality of columns and a plurality of bit lines, each bit line being associated with at least one respective column of said plurality. The semiconductor memory device further includes a bit line selection structure, for selecting at least one among said bit lines and a voltage clamping circuit structure adapted to cause the clamping at a prescribed voltage of unselected bit lines adjacent and capacitively coupled to a selected bit line during a read operation.

BRIEF DESCRIPTION OF THE DRAWINGS

The features and advantages of the present invention will be made clear by the following description of some preferred embodiments thereof, given purely by way of a non-restrictive indication, with reference to the attached drawings, wherein.

DETAILED DESCRIPTION OF THE INVENTION

Figure 1:
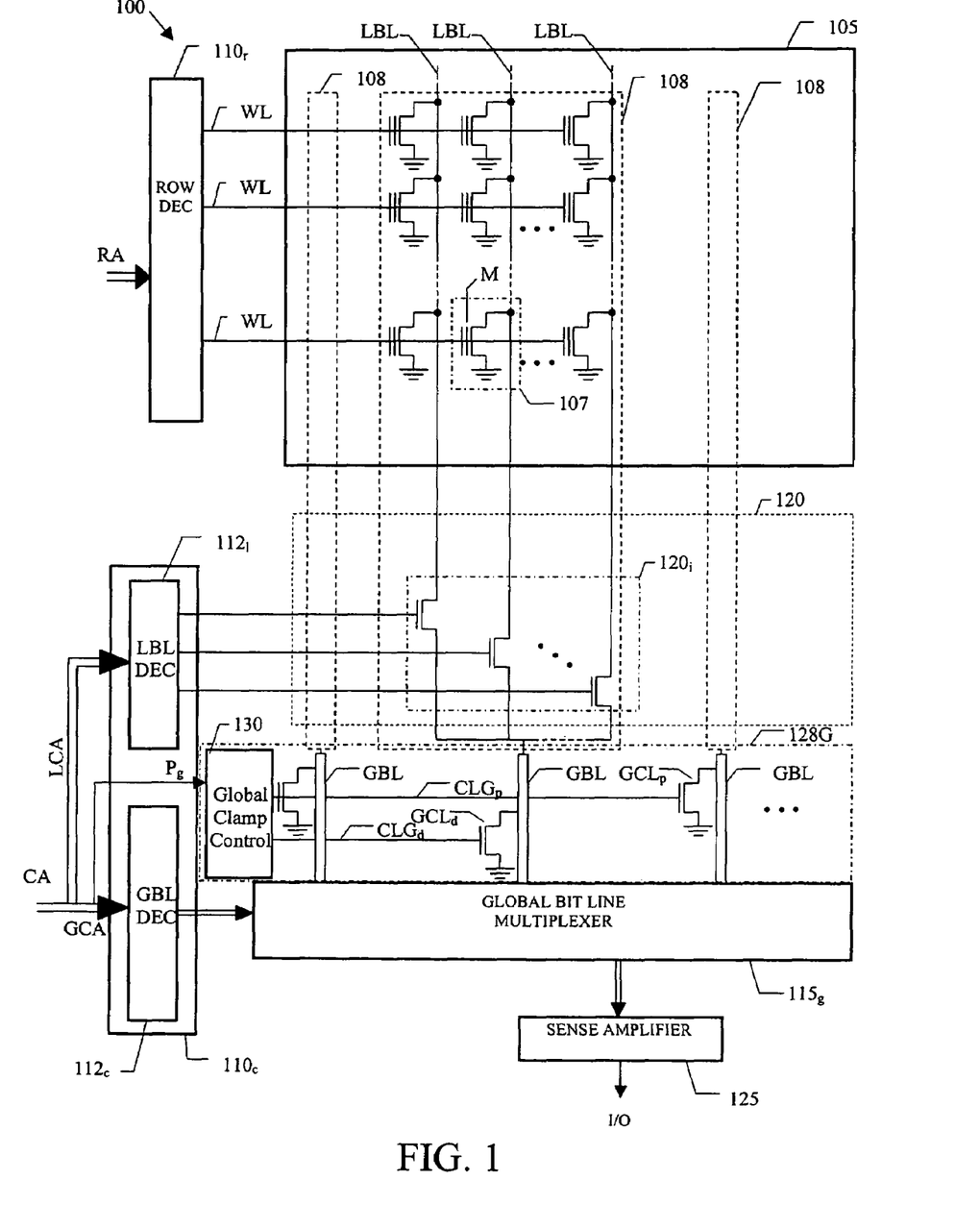
FIG. 1 illustrates schematically the structure of a memory device, according to a first embodiment of the present invention.

With reference to FIG. 1, a portion of a non-volatile memory device 100, in particularly a flash E2PROM, is schematically illustrated. The flash memory 100 is integrated in a chip of semiconductor material; a matrix 105 of memory cells 107 (particularly, a memory matrix having a NOR architecture, as shown in the FIG. 1) is used for storing data.

Each cell 107 includes a floating gate MOS transistor M. In an erased condition, the cell 107 has a low threshold voltage. The cell 107 is programmed by injecting electric charges into its floating gate; in the programmed condition, the memory cell 107 has a high threshold voltage value. Therefore, the value of the threshold voltage defines the different logic values that the datum stored in the memory cell 107 may assume. The memory cell is erased by removing the electrical charge stored in its floating gate.

The memory cells 107 are organized by rows and columns. The matrix 105 includes a word line WL per each row. The row selection is carried out by means of a row decoder 110r, receiving a row address RA, decoding it and selecting a corresponding row. Particularly, the row decoder 110r biases the word line WL corresponding to the selected memory cell(s) 107 to a high voltage value (for example, to a value corresponding to a supply voltage Vdd of the memory), while the other word lines are driven to a low voltage value (for example, to the value corresponding to ground).

According to the example illustrated in FIG. 1, the column selection is instead done in two levels, according to a hierarchical bit line architecture; a higher or global hierarchical level is constituted by global bit lines GBL. Each global bit line GBL connects to a packet 108 of local bit lines LBL (lower or local hierarchical level), each one associated with a respective column of the matrix 105.

A column decoder 110c receives a column address CA, and suitably drives the bit line selection of the matrix 105. The column address consists of two parts: a global column address GCA, and a local column address LCA. The global column address GCA is provided to an input of a circuital block 112c, included for example into the column decoder 110c, responsible for the column addressing at the global level (global bit line decoder). The global bit line decoder 112c drives a multiplexer 115g (global bit line multiplexer). Therefore, the global bit line multiplexer 115g selects the global bit line GBL connected to the packet 108 of local bit lines corresponding to the addressed memory cell 107. The other packets 108 of local bit lines are instead kept isolated from a sense amplifier 125 (whose purpose will be explained in the following). The local column address LCA is provided to the input of another section of the column decoder 110c, i.e., to a local column decoder 112l, whose purpose is to correctly drive a local multiplexer circuit 120 in such a way to discriminate the bit line that is to be selected among the packet 108 of local bit lines corresponding to the chosen global bit line GBL. In particular, the local multiplexer circuit 120 includes a plurality of local multiplexers 120i, each one associated to a respective packet 108 of local bit lines. In the same way as the global bit lines GBL, the local bit lines LBL belonging to the selected packet 108 of local bit lines that do not correspond to the addressed memory cell 107 are kept isolated from the global bit line GBL. Consequently, a generic memory cell 107 is individuated by means of a word line WL and a local bit line LBL that belong to a specific packet 108 of local bit lines corresponding to a respective global bit line GBL.

For the purpose of reading the datum stored in the memory cell 107, the sense amplifier 125 is connected to the output of the global bit line multiplexer 115g. The sense amplifier 125 receives memory cell current value corresponding to the state of the selected memory cell 107, and provides an amplified full-logic version thereof, made available at memory output terminals (not shown in FIG. 1).

The concepts of the present invention are also applicable if the flash memory has a different architecture, if the memory cells are implemented with other components, or if the memory cells are adapted to be programmed into a different number of levels. Similar considerations apply if the addressing logic is different, if the column selection includes more than two hierarchic levels, and if another memory device (e.g., an EPROM) is used. Moreover, the memory matrix may be subdivided in more than one memory sectors.

Still referring to FIG. 1, and according to an embodiment of the invention, a global voltage clamping circuit 128G is provided. The global clamping circuit 128G is adapted to hold to a prescript voltage, e.g., the ground, the ("side") bit lines adjacent to a selected bit line during a reading operation, for solving the previously described drawbacks due to the capacitive coupling among adjacent bit lines.

In particular, the global clamping circuit 128G includes a global clamping control circuit 130, and two arrays of clamping transistors GCLd, GCLp.

The global clamping control circuit 130 receives a signal Pg, taken from the global column address GCA (as will be explained in the following in higher detail). Moreover, the global clamping control circuit 130 is connected to an even global clamping control line CLGP and to an odd global clamping control line CLGd. The two control lines CLGp and CLGd are connected to global clamping transistors arranged in two arrays interdigitated one to each other. A first array contains all the global clamping transistors GCLp connected to the global bit lines GBL in even positions; the global clamping transistors of the first array are connected to the global clamping control circuit 130 by means of the even global clamping control line GCLp. A second array contains all the global clamping transistors GCLd connected to the global bit lines GBL in odd positions; the global clamping transistors of the second array are connected to the global clamping control circuit 130 by means of the odd global clamping control line GCLd.

Figure 2A:
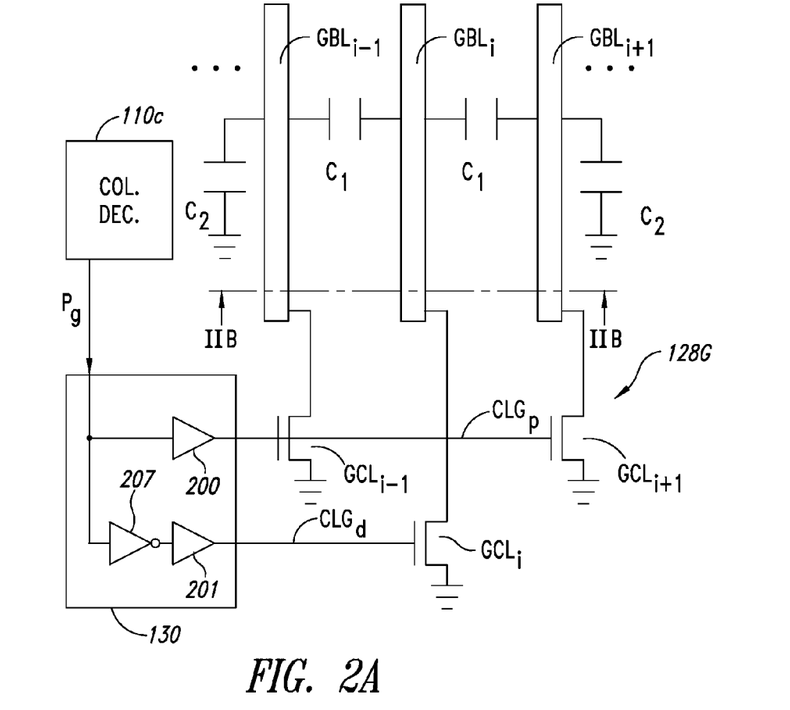
FIG. 2A illustrates in more detail a portion of the memory device.

FIG. 2A schematically illustrates a detail of the memory device 100, in which the essential elements for comprising the functioning of the global clamping circuit 128G are pointed out.

Particularly, there are illustrated the parasitic fringing capacitance C1 among the adjacent global bit lines GBLk−1 and GBLk, GBLk and GBLk+1, and the parasitic fringing capacitance C2 between the global bit lines and ground. The parasitic capacitances C1 and C2 are responsible for generating the capacitive coupling among bit lines.

Figure 2B:
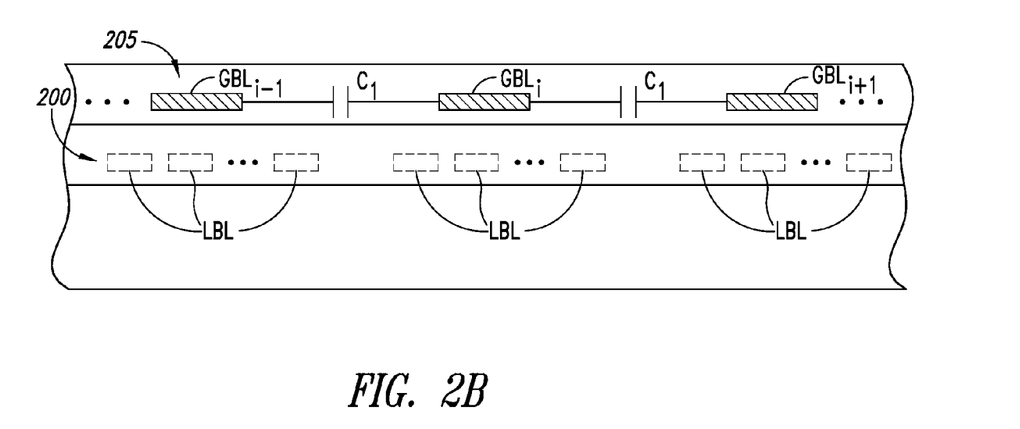
FIG. 2B illustrates very schematically a cross sectional view along line IIB-IIB of FIG. 2A.

FIG. 2B is a very simplified cross-sectional view of the structure shown in the FIG. 2A, along the line IIB-IIB. In this section, only some elements of the complete structure are represented. More particularly, FIG. 2B illustrates a particular architectural implementation of the two level column hierarchical structure. In this case, the first hierarchical level, formed by the local bit lines LBL, is arranged according to a first layer 200 of conductive lines, realized from a first type of conductive material. The second hierarchical level, formed by the global bit lines GBL, is instead arranged according to a further layer 205 of lines, realized from a second type of conductive material. More particularly, the local bit lines LBL formed in the first layer 200 may be realized from a first level of metal, while the global bit lines GBL formed in the further layer 205 may be realized from a further layer of metal. For example, the first metallic level may be realized by means of a first metallic layer "metal1", while the further metallic layer may be realized by means of a higher metallic level "metal3" (an intermediate metallic layer, "metal2", being for example used for forming the word lines, or the global clamping control lines CLGp, CLGd). If the matrix includes more than one memory sector, the global bit lines GBL (realized in metal3) may be in common to more sectors, while the local bit lines LBL (realized in metal1) preferably would not be.

Referring again to the FIG. 2A, when the generic global bit line GBLk is selected during a reading operation, the latter bit line and the local bit lines corresponding thereto are precharged to the voltage value of VD, as previously described. During the precharging, the adjacent bit lines GBLk−1 and GBLk+1 charge to a voltage value V given by the capacitive divider formed by the capacitances C1 and C2:

$$V = \frac{V_D C_1}{(C_1 + C_2)}.$$

For bringing the global bit lines GBLk−1 and GBLk+1 to a voltage value substantially equal to the ground, it is necessary to discharge themselves by activating the corresponding global clamping transistors GCLk−1 and GCLk+1. Thanks to the two arrays-arrangement of the global clamping transistors, for discharging the adjacent global bit lines GBLk−1 and GBLk+1, it is sufficient to activate a specific clamping control line, in the example at issue the even global clamping control line CLGp, that provides the necessary biasing for activating the correct clamping transistors.

The global clamping control circuit 130 is responsible of the activation of the correct array of global clamping transistors. For being capable to discriminate which one between the two possible arrays of global clamping transistors has to be activated (and, thus, which one between the global clamping control lines CLGp or CLGd), it is sufficient to know at which array the global clamping transistor connected to the addressed global bit line GBLk belongs. In fact, the global clamping transistors connected to the adjacent global bit lines belongs to the opposite array. For this purpose, the input signal Pg of the global clamping control circuit may be a signal representing the least significant bit of the global column address GCA. For example, if the least significant bit of the global column address GCA is "0", the signal Pg assumes the ground voltage, otherwise, if the least significant bit of the global column address GCA is "1", the signal Pg assumes the supply voltage. Therefore, it is possible to speak of the signal Pg in the same way as to the "bit" Pg. The global clamping control lines CLGp and CLGd are asserted in a mutually-exclusive way. For example, if the bit Pg has a logic value equal to "1" (i.e., the selected global bit line corresponds to an odd position), it is asserted the even global clamping control line CLGp, while the odd global clamping control line CLGd is deasserted Referring to FIG. 2A, a circuital implementation of the global clamping control circuit 130 is shown, according to an embodiment of the invention. The global clamping control circuit 130 includes an input terminal receiving the bit Pg, two buffer circuits 200, 201, and a logic gate acting as inverter 207. The buffer circuit 200 has an input terminal receiving the bit Pg, and an output terminal connected to the even global clamping control line CLGp. The inverter 207 has an input terminal receiving the bit Pg and an output terminal connected to the input terminal of the buffer circuit 201. The buffer circuit 201 further includes an output terminal connected to the odd global clamping control line CLGd.

The concepts of the present invention are also applicable if the control logic circuitry is implemented with an equivalent combinatorial circuit, if the logic gates are differently interconnected, and so on.

Still referring to FIG. 2A, it is possible to demonstrate that the discharging time T of the adjacent global bit lines GBLk−1 and GBLk+1 directly depends from the fringing capacitance among bit lines C1, and inversely depends from the discharging current I generated by the global clamping transistors GCL:

$$T = \frac{V_D C_1}{I}$$

(by adopting a constant discharging current I approximation).

The values of the fringing capacitances C1 between adjacent global bit lines GBL strongly depend from the dimensions and material of the global bit lines GBL themselves. The Applicant has observed that, in the practical cases, the value of the fringing capacitances C1 between adjacent global bit lines GBL is higher than the one of the corresponding fringing capacitances between adjacent local bit lines LBL by an order of magnitude. In this case, the local fringing contribution due to the coupling among local bit lines LBL is negligible with respect to the global one due to the coupling among global bit lines GBL.

Consequently, making only use of global clamping circuits, it is possible to dimension the global clamping transistors GCLp and GCLd in such a way that the discharge time T results lower with respect to the time necessary for the sense amplifier 125 to recognize the value of the datum stored into the addressed memory cell 107. In this way, it is possible to have a reasonable certainty of having correctly read the datum stored into the addressed memory cell 107.

The fringing problem on global bit lines is effectively resolved by using global clamping devices, according to the structure illustrated in FIG. 1.

Figure 3:
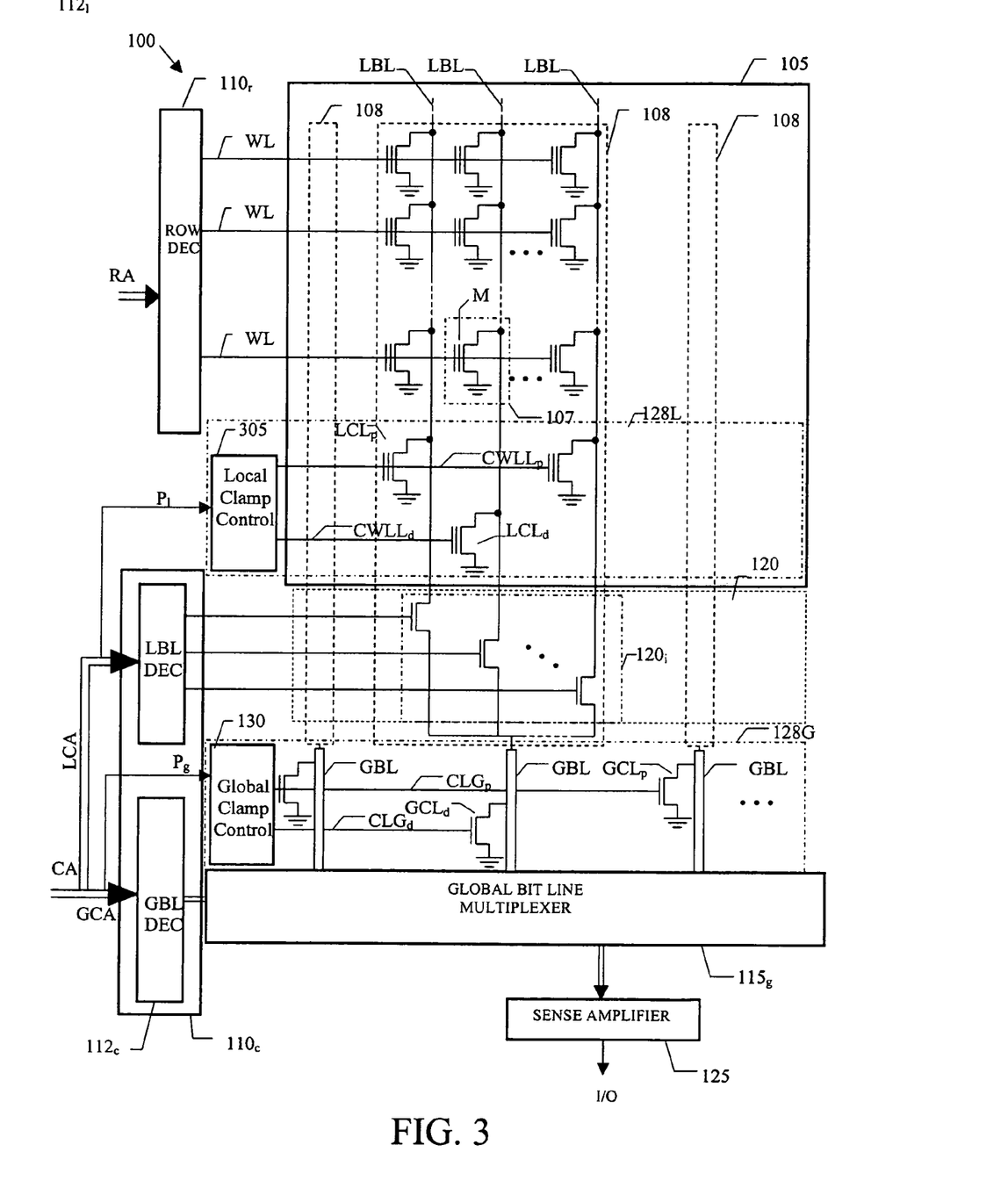
FIG. 3 illustrates schematically the structure of the memory device, according to a second embodiment of the present invention.

In FIG. 3 a further embodiment of the present invention is shown, including, in addition to the global clamping circuit 128G, a local clamping circuit 128L, adapted to operate on the local bit lines LBL.

The local clamping circuit 128L comprises a local clamping control circuit 305 and two arrays of clamping elements LCLd, LCLp; the connections are similar to those of the global clamping circuit 128G. The clamping elements LCLc, LCLp are, in the example, memory cells, and particularly not programmed, capable to drive an adapted amount of current. These cells, preferably not available to the user for storing information, are connected to the local bit lines LBL according to the same two-arrays arrangement of the global clamping circuit 128G. Even in this case, the local clamping cells LCLp in even positions are driven by the local clamping control circuit 305 by means of a dedicated common word line CWLLp, in the same way as the local clamping cells LCLd in odd positions, that are driven by means of a further dedicated common word line CWLLd.

The local clamping control circuit 305 may have a circuital structure similar to the one previously described referring to the global clamping circuit 128G, and illustrated in FIG. 2A.

In this case, the input terminal of the local clamping control circuit 305 receives the least significant bit P1 of the local column address LCA.

Figure 4:
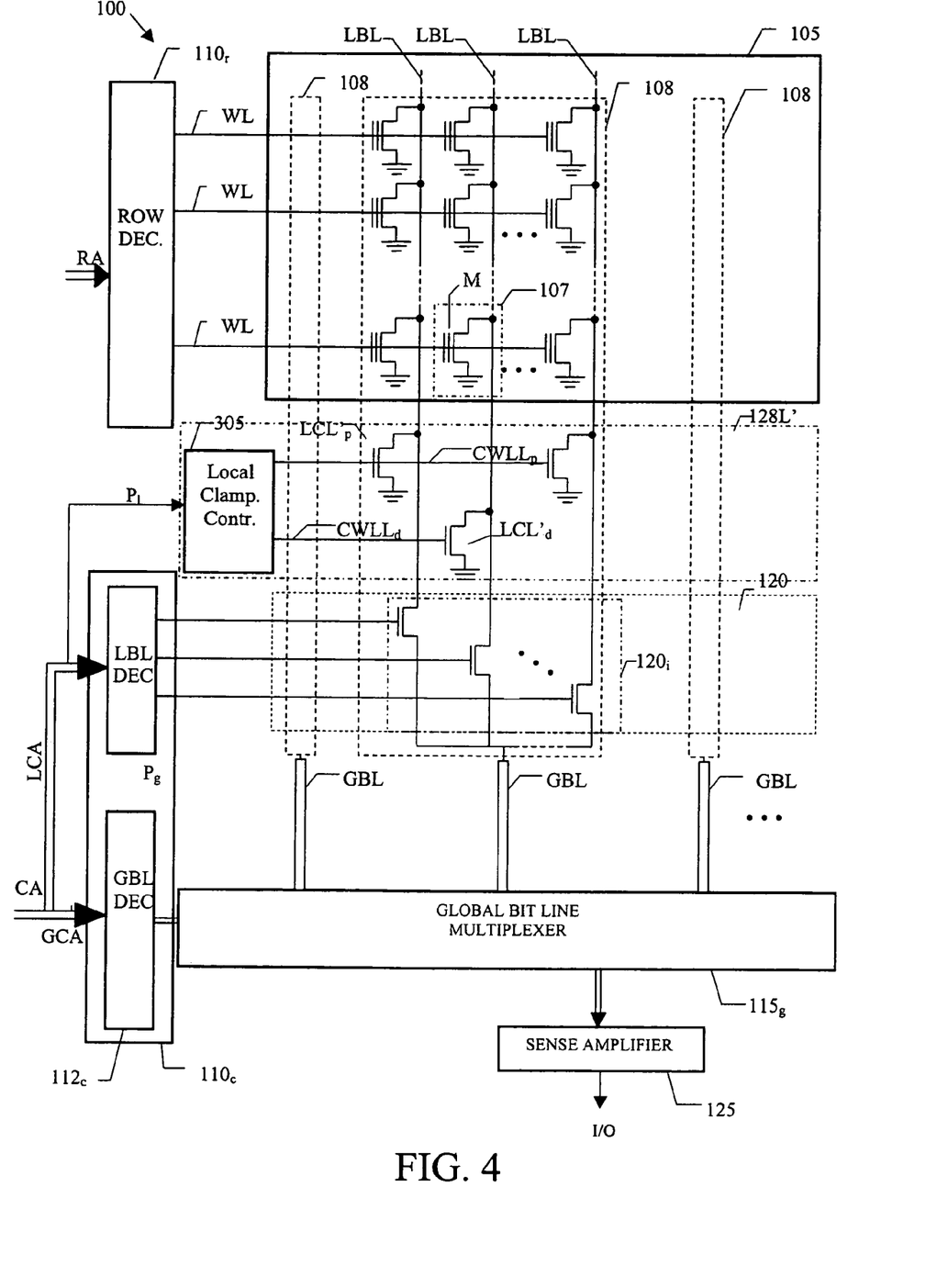
FIG. 4 illustrates schematically the structure of the memory device according to a third embodiment of the present invention.

Referring now to FIG. 4, a still further embodiment of the present invention is shown, including a local clamping circuit 128L adapted to operate on the local bit lines LBL, but in which the local clamping elements LCLp' and LCLd' are MOS transistors placed outside the memory matrix 105, instead of being memory cells. Like the local clamping cells of the local clamping circuit 128L, and like the global clamping transistors of the global clamping circuit 128G, even in this case, the local clamping transistors LCLp' and LCLd' are arranged according to two arrays interdigitated one to each other, and are asserted following the same principle of functioning.

The local clamping circuit 128L or 128L' may be provided both in combination with the global clamping circuit 128G, and in absence of the latter.

Figure 5:
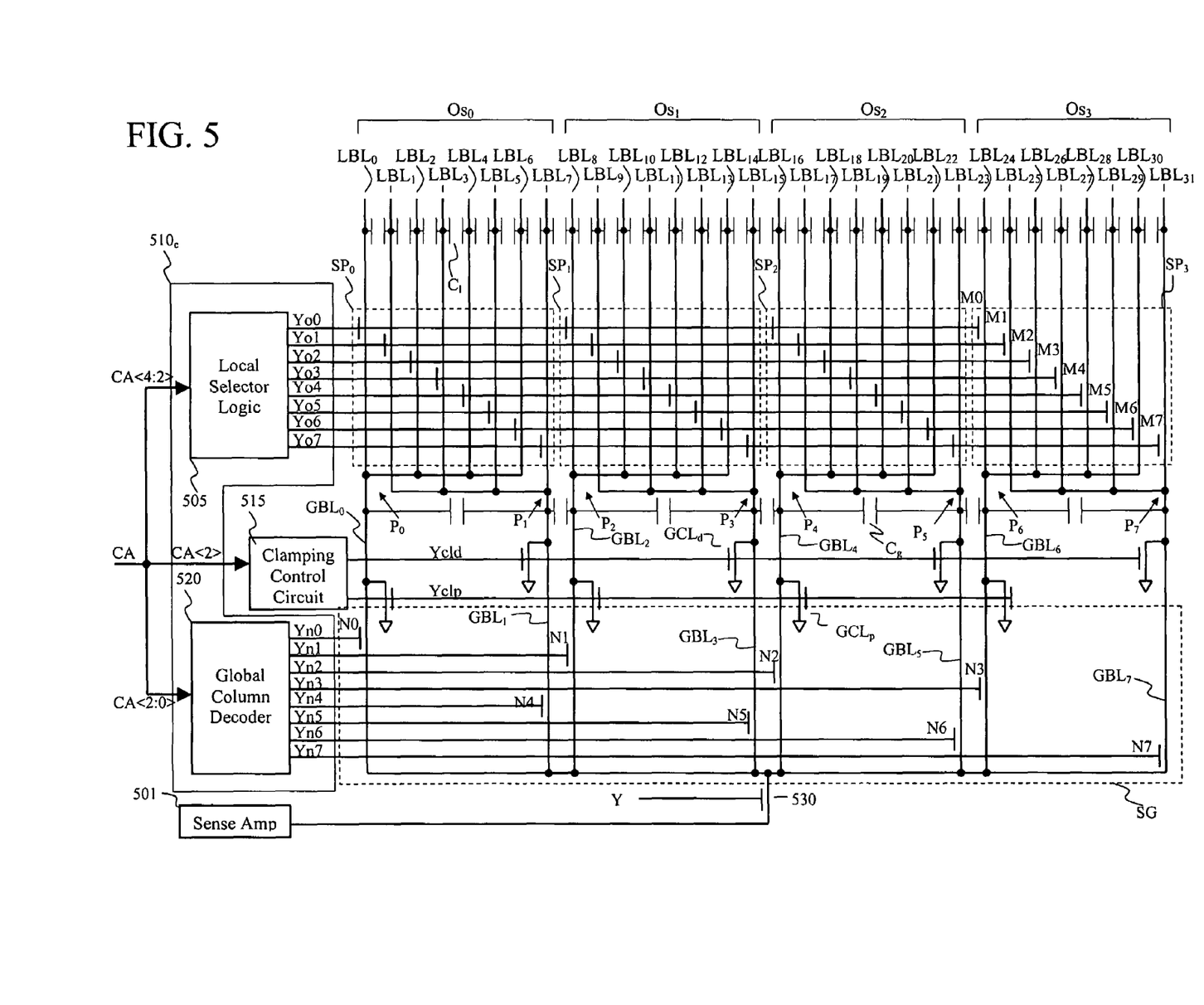
FIG. 5 illustrates schematically the structure of the memory device according to a fourth embodiment of the present invention

In FIG. 5, a further solution is shown that allows clamping the local bit lines by exploiting the global clamping circuit, without the need of providing dedicated local clamping circuits. Because of graphical space constraints, the symbol used for representing MOS transistors in FIG. 5 is drawn in a different and simpler way with respect to the usual.

According to the example herein considered, a plurality (thirty two in this example) of local bit lines $LBL_i$ (i=0 to 31) associated with a sense amplifier 501 is illustrated; the local bit lines consist for example of conductive strips realized by photolithography from the first layer of metal 200, as shown in FIG. 2B.

The local bit lines $LBL_i$ can be ideally grouped into two different, first and second sets. Assuming to associated an index to the local bit lines, the local bit lines $LBL_i$ belonging to the first set (even local bit lines) are identified by an index "i" which takes even values (i.e., 0,2, . . . ), while the local bit lines $LBL_i$ belonging to the second set (odd local bit lines) are identified by an index "i" which takes odd values (i.e., 1,3, . . . ).

The local bit lines $LBL_i$ are also grouped together in packets $P_j$ (j=0 to 7) of, in the example, four bit lines $BL1_i$ each. The generic packet $P_j$ is associated with a corresponding global bit line $GBL_j$, belonging to the global hierarchical level, and, referring to FIG. 2B, consisting of a conductive strip realized by photolithography from the second layer of metal 205.

According to an embodiment of the present invention, the packets $P_j$ having even j indexes (i.e., the packets $P_j$ associated with an even global bit line $GBL_j$) include only even local bit lines $LBL_i$, while the packets $P_j$ having odd j indexes (i.e., the packets $P_j$ associated with an odd global bit line $GBL_j$) include only odd local bit lines $LBL_i$. According to the embodiment of the invention herein described, the packet $P_0$ includes the bit lines $LBL_0$, $LBL_2$, $LBL_4$, $LBL_6$; the packet $P_1$ includes the bit lines $LBL_1$, $LBL_3$, $LBL_5$, $LBL_7$; the packet $P_2$ includes the bit lines $LBL_8$, $LBL_{10}$, $LBL_{12}$, $LBL_{14}$; the packet $P_3$ includes the bit lines $LBL_9$, $LBL_{11}$, $LBL_{13}$, $LBL_{15}$; the packet $P_4$ includes the bit lines $LBL_{16}$, $LBL_{18}$, $LBL_{20}$, $LBL_{22}$; the packet $P_5$ includes the bit lines $LBL_{17}$, $LBL_{19}$, $LBL_{21}$, $LBL_{23}$; the packet $P_6$ includes the bit lines $LBL_{24}$, $LBL_{26}$, $LBL_{28}$, $LBL_{30}$; the packet $P_7$ includes the bit lines $LBL_{25}$, $LBL_{27}$, $LBL_{29}$, $LBL_{31}$. In other words, the (even) local bit lines $LBL_i$ of a generic packet $P_j$ having an even j index are alternated to the (odd) local bit lines $LBL_i$ of the subsequent generic packet $P_{j+1}$. The (even) bit lines $LBL_i$ of a packet $P_j$ having an even j index, together with the (odd) bit lines $LBL_i$ of the corresponding subsequent packet $P_{j+1}$ forms a super-set $Os_l$ (I=0 to 3) of local bit lines.

The generic local bit line $LBL_i$ belonging to a generic super-set $Os_l$ is selected among the other local bit lines $LBL_i$ belonging to the same super-set $Os_l$ by means of a respective local selector circuit $SP_l$, corresponding to that super-set $Os_l$. The local selector circuits $SP_l$ are each one connected to eight command lines. Said eight command lines (the same for all the local selector circuits $SP_l$) are driven by a local selector logic 505 included in a column decoder 510c, and carry eight local bit line selection signals Yo0, Yo1, Yo2, Yo3, Yo4, Yo5, Yo6 and Yo7.

The generic local selector circuit $SP_l$ comprises individual selectors, e.g., pass-transistors M0-M7 for each of the local bit lines $LBL_i$ of the super-set, and each of said pass-transistor is controlled by a respective one of the local bit line selection signals Yo0-Yo7. The individual selectors M0-M7 in the local selectors $SP_l$ are arranged in such a way that the first local bit line $LBL_i$ of the generic super-set $Os_l$ is associated with the signal Yo0, the second bit line with the signal Yo1, the third bit line with the signal Yo2 and so on, with the last bit line of the generic super-set $Os_l$ being associated with the signal Yo7.

Each global bit line $GBL_j$ is selected among the other global bit lines $GBL_j$ by means of a global selector circuit SG, connected to eight command lines. Said command lines are driven by a global column decoder 520 included in the column decoder 510c and carry eight global signals Yn0, Yn1, Yn2, Yn3, Yn4, Yn5, Yn6, Yn7.

The global selector circuit SG comprises individual selectors N0-N7, e.g., pass-transistors, for each one of the global bit lines $GBL_j$. Each one of said pass-transistors is controlled by a respective one of the global bit line selection signals Yn0-Yn7. The global bit lines $GBL_j$ are all together coupled to the sense amplifier 501 by means of a single further pass-transistor 530. The pass-transistor 530 is controlled by a selection signal Ym for the purpose of selectively isolating all the global bit lines from the sense amplifier.

In FIG. 5, the capacitive coupling between adjacent local bit lines $LBL_i$ is illustrated by means of "local" fringing capacitances Cl, for simplicity represented as lumped circuit elements; the capacitive coupling between adjacent global bit lines $GBL_j$ is represented by means of "global" fringing capacitances Cg.

According to the embodiment of the invention illustrated in FIG. 5, a global voltage clamping circuit is provided. The voltage clamping circuit includes global clamping transistors $GCL_p$, $GCL_d$, connected to two clamping control lines Ycld, Yclp. Even in this case, the connection scheme of the global clamping transistors $GCL_p$, $GCL_d$ to the global bit lines is in accordance to two arrays. A first array contains even global clamping transistors $GCL_p$ connected to the even global bit lines $GBL_j$, and a second array contains odd global clamping transistors $GCL_d$ connected to the odd global bit lines $GBL_j$. The even global clamping transistors $GCL_p$ are driven by the clamping control line Yclp; the odd global clamping transistors $GCL_d$ are driven by the clamping control line Ycld.

The driving of the two clamping control lines Yclp, Ycld is managed by a clamping control circuit block 515. During the reading operation, if the selected cell is connected to a bit line $LBL_i$ belonging to a packet $P_j$ having an even j index, all the odd global clamping transistors $GCL_d$ are activated by means of a suitable biasing of the corresponding clamping control line Ycld. On the contrary, if the selected cell is connected to a bit line $LBL_i$ belonging to a packet $P_j$ having an odd j index, all the even global clamping transistors $GCL_p$ are activated by means of a suitable biasing of the corresponding clamping control line Yclp.

The clamping control circuit 515 drives the clamping control lines Yclp, Ycld in a complementary, mutually opposite manner, with voltages equal to the supply voltage Vdd or the ground voltage. When for example the clamping control line Yclp is driven to the supply voltage Vdd by the clamping control circuit block 515, all the even global clamping transistors $GCL_p$ are activated, thus all the even global bit lines $GBL_j$ are grounded. On the contrary, when the clamping control line Ycld is driven to the supply voltage Vdd by the clamping control circuit block 515, all the odd global clamping transistors $GCL_d$ are activated, thus all the odd global bit lines $GBL_j$ are grounded.

The column decoder 510c receives a column address CA, and properly biases the command lines carrying the global bit line selection signals Yn0-Yn7, from now on Yn<7:0>, and the command lines carrying the local bit line selection signals Yo0-Yo7, from now on Yo<7:0>, depending on the value of the column address CA. Since (according to the example at issue) each sense amplifier 501 is associated with 32 local bit lines $LBL_i$, and each packet $P_j$ of local bit lines $LBL_i$ includes four local lines $LBL_i$, the column address CA has to include at least 5 bits. More particularly, indicating with CA<4:0> the complete 5-bit column address, a first 3-bit address portion CA<2:0> of the column address is exploited for performing the selection of a global bit line $GBL_j$ among the others, while a second 3-bit address portion CA<4:2> is exploited for performing the selection of a local bit line $LBL_i$ among the others connected to the selected global bit line $GBL_j$.

The first address portion CA<2:0> is provided to the global column decoder 520. Adopting a so-called Binary Coded Decimal (BCD) relationship between addresses and global bit line selection signals Yn0-Yn7, the global column decoder 520 asserts, i.e., biases to the supply voltage Vdd, a corresponding one among the control lines Yn<7:0> according to the following table:

| CA<2:0> | Asserted control line |
|---|---|
| 000 | Yn<0> |
| 001 | Yn<1> |
| 010 | Yn<2> |
| 011 | Yn<3> |
| 100 | Yn<4> |
| 101 | Yn<5> |
| 110 | Yn<6> |
| 111 | Yn<7> |

Moreover, according to this embodiment of the invention, the individual pass-transistors N0-N7 in the global selector circuit SG are arranged in such a way that the global bit line $GBL_0$ is associated with the global bit line selection signal Yn0 by means of the pass-transistor N0, the global bit line $GBL_1$ with the signal Tn4 by means of the pass-transistor N4, the global bit line $GBL_2$ with the signal Yn1 by means of the pass-transistor N1, the global bit line $GBL_3$ with the signal Yn5 by means of the pass-transistor N5, the global bit line $GBL_4$ with the signal Yn2 by means of the pass-transistor N2, the global bit line $GBL_5$ with the signal Yn6 by means of the pass-transistor N6, the global bit line $GBL_6$ with the signal Yn3 by means of the pass-transistor N3, and the global bit line $GBL_7$ with the signal Yn7 by means of the pass-transistor N7.

More generally, when $2^k$ global bit lines $GBL_j$ (j=0 to $2^k-1$) are connected to a single sense amplifier 505, the first address portion of the column address has to include k bits CA<k−1:0>, and the individual pass transistors (in this case N0-N(K−1)) in the global selector circuit SG are arranged in the following way:

the even global bit line $GBL_0$ is associated with the global bit line selection signal Yn0 by means of the pass-transistor N0, the even global bit line $GBL_2$ is associated with the signal Yn1 by means of the pass-transistor N1, the even global bit line $GBL_4$ is associated with the signal Yn2 by means of the pass-transistor N2, . . . , and the even global bit line $GBL_{(2^k-2)}$ is associated with the signal $Yn(2^{k-1}-1)$;

the odd global bit line $GBL_1$ is associated with the global bit line selection signal $Yn(2^{k-1})$ by means of the pass-transistor $N(2^{k-1})$, the odd global bit line $GBL_3$ with the signal $Yn(2^{k-1}+1)$ by means of the pass-transistor $N(2^{k-1}+1)$, the odd global bit line $GBL_5$ with the signal $Yn(2^{k-1}+2)$ by means of the pass-transistor $N(2^{k-1}+2)$, . . . , and the odd global bit line $GBL_{(2^k-1)}$ with the signal $Yn(2^k-1)$ by means of the pass-transistor $N(2^k-1)$.

The clamping control circuit block 515 receives a bit of the column address CA<2:0>, more specifically the bit CA<2>. Then, the clamping control circuit 515 asserts, i.e., biases to the supply voltage Vdd, a corresponding one between the two clamping control lines Yclp, Ycld according to the following table:

| CA<2> | Asserted clamping control line |
|---|---|
| 0 | Ycld |
| 1 | Yclp |

The second address portion CA<4:2> is provided to the local selector logic 505. According to the present embodiment of the invention, in response to the second address portion CA<4:2>, the local selector logic 505 asserts three among the eight local bit line selection lines Yo<7:0>, in such a way to select three local bit lines $LBL_i$ among the local bit lines of a super-set $Os_j$, as in the following table:

| CA<4:2> | Asserted control lines |
|---|---|
| 000 | Yo<0>, Yo<7>. Yo<1> |
| 001 | Yo<1>, Yo<0>. Yo<2> |
| 010 | Yo<2>, Yo<1>. Yo<3> |
| 011 | Yo<3>, Yo<2>. Yo<4> |
| 100 | Yo<4>, Yo<3>. Yo<5> |
| 101 | Yo<5>, Yo<4>. Yo<6> |
| 110 | Yo<6>, Yo<5>. Yo<7> |
| 111 | Yo<7>, Yo<6>. Yo<0> |

As can be seen in the second column of the previous table, the first control line indicated in each box corresponds to the pass-transistor Mj (j=0 to 7) connected to the addressed local bit line $LBL_i$ (i.e., the one connected to the addressed memory cell 107, in the example considered) among the other local bit lines of the super-set $Os_j$. Moreover, the other two control lines correspond to the preceding and to the subsequent control lines, i.e., to the pass transistors M(j−1) and M(j+1) (j=0 to 7, M(−1)=M(7) and M8=M0).

Thanks to the fact that a generic local bit line $LBL_i$ of a packet $P_j$ is surrounded (i.e., is preceded and followed; the local bit lines at the edges are only followed, or preceded) by adjacent local bit lines $LBL_{i-1}$, $LBL_{i+1}$ that belongs to a packet(s) that is (are) different, and according to the correlation relationship among column addresses CA<4:0> and control lines to be addressed illustrated in the previous three tables, the clamping of the global bit lines automatically causes the clamping of the local bit lines, even if no local clamping circuit exists.

For example, if the column address CA<4:0> is equal to 11100, the first address portion CA<2:0> is equal to 100, so the control line Yn<4> is asserted. In this way, the global bit line $GBL_1$ is selected, connected to the pass-transistor N4. The global bit line $GBL_1$ corresponds to the packet of bit lines $P_1$, forming with the packet $P_0$ the super-set $Os_0$. Since CA<2> is equal to 1, the clamping control line Yclp is asserted. In this way, all the even clamping transistors GCLp are activated, and the even global bit lines $GBL_j$ (including the adjacent ones to the global bit line $GBL_1$, i.e., $GBL_0$ and $GBL_2$) are clamped to the ground voltage. The second address portion CA<4:2> is equal to 111, so the control line Yo<7>, the control line Yo<6> and the control line Yo<0> are all asserted. The control line Yo<7> corresponds to the pass transistors M7, connected to local bit lines belonging to packets $P_j$ having an odd j index. On the contrary, the control lines Yo<6> and Yo<0> correspond to pass transistors (M0 and M6) connected to local bit lines belonging to packets $P_j$ having an even j index. Since the selected global bit line $GBL_1$ is connected to an odd packet $P_1$ of local bit lines $LBL_i$, the only local bit line that have a connection with the sense amplifier 501 (if the pass-transistor 530 is activated) is the local bit line $LBL_7$, connected to the global bit line $GBL_1$ by the pass transistor M7. This means that the addressed memory cell 107 is connected to the selected local bit line $LBL_7$. Moreover, all the local bit lines $LBL_i$ connected with the pass transistors M0 and M6 are selected and connected to the respective even global bit lines $GBL_j$, which are in turn clamped to the ground voltage by means of the even clamping transistors GCLp. Among the clamped local bit lines $LBL_i$ there are also the local bit line $LBL_6$ (packet $P_0$, super-set $Os_0$) and the local bit line $LBL_8$ (packet $P_2$, super-set $Os_1$), i.e., the bit lines adjacent to the selected local bit line $LBL_7$. In other words, the selected memory cell 107 is connected to the local bit line $LBL_7$, connected in turn to the global bit line $GBL_1$, and all the bit lines adjacent thereto results clamped to the ground voltage, both at the global level ($GBL_0$ and $GBL_2$) and at the local level ($LBL_6$ and $LBL_8$).

The present invention has been disclosed by describing an exemplary embodiment thereof, however those skilled in the art, in order to satisfy contingent needs, will readily devise modifications to the described embodiment, as well as alternative embodiments, without for this reason departing from the protection scope defined in the appended claims.

What is claimed is:

1. A semiconductor memory device, comprising:
   a memory matrix comprising a plurality of memory cells, arranged according to a plurality of rows and a plurality of columns;
   a plurality of bit lines, each bit line being associated with at least one respective column of said plurality;
   a bit line selection structure structured to select at least one of said bit lines; and
   a voltage clamping circuit structure structured to cause clamping at a prescribed voltage of unselected bit lines adjacent and capacitively coupled to the selected at least one of said bit lines during a read operation, wherein said voltage clamping circuit structure includes:
   a plurality of controlled clamping devices, each one univocally connected to a respective bit line;
   a control circuit structured to selectively activate the controlled clamping devices, wherein said plurality of controlled clamping devices is arranged according to at least two arrays, the bit lines connected to the controlled clamping devices of one of the at least two arrays being alternated with the bit lines connected to the controlled clamping devices of another one of the at least two arrays; and
   a hierarchic column selection structure comprising:
   a first hierarchic level comprising first-level bit lines, each one associated with a respective column of said plurality;
   a levels hierarchy of levels higher than the first hierarchic level, said levels hierarchy comprising at least one higher hierarchic level higher than the first hierarchic level, said higher hierarchic level comprising respective higher-level bit lines, each one associated with a respective packet of lower-level bit lines belonging to a lower hierarchic level lower than said higher hierarchic level; and
   a bit line selection structure for selecting at least one of the bit lines of the at least one higher hierarchic level.

2. The semiconductor memory device of claim 1, wherein said control circuit is structured to activate in a mutually exclusive manner the controlled clamping devices of the at least two arrays, such that the control circuit activates a first array of the at least two array which does not include the controlled clamping device connected to the at least one selected bit line.

3. The semiconductor memory device of claim 1, wherein said plurality of controlled clamping devices includes MOS transistors.

4. The semiconductor memory device of the claim 1, wherein said at least one voltage clamping circuit includes a global voltage clamping circuit associated with said at least one higher hierarchic level.

5. The semiconductor memory device of claim 4, wherein the first-level bit lines are formed from a first conductive layer, and the bit lines belonging to the at least one higher hierarchic level are formed from a respective further conductive layer, distinct from the first conductive layer.

6. The semiconductor memory device of claim 4, wherein the global voltage clamping circuit includes MOS transistors formed outside said at least one memory matrix.

7. The semiconductor memory device of claim 1, wherein said at least one voltage clamping circuit comprises a local clamping circuit associated with the first-level bit lines.

8. The semiconductor memory device of claim 7, wherein said local clamping circuit includes MOS transistors, said MOS transistors comprising dedicated memory cells of said plurality, said memory cells being not available for storing information.

9. The semiconductor memory device of claim 1, including a physical arrangement of the lower-level bit lines such that, for a generic lower-level bit line, at least one of the lower-level bit lines adjacent thereto belongs to a packet of lower-level bit lines different from the packet of lower-level bit lines to which said generic lower-level bit line belongs.

10. The semiconductor memory device of claim 9, wherein the higher-level bit lines are arranged in a first and a second groups of higher-level bit lines, the higher-level bit lines belonging to the first group being alternated to the higher-level bit lines belonging to the second group.

11. The semiconductor memory device of claim 10, wherein the lower-level bit lines of a generic first packet associated with a first higher-level bit line of the first group are alternated with the lower-level bit lines of a second packet associated with a second higher-level bit line of the second group adjacent to the first higher-level bit line, the first and the second packets forming together a super-set of lower-level bit lines.

12. The semiconductor memory device of claim 11, wherein the hierarchic column selection structure comprises a lower-level bit line selection structure for selecting at least one among the lower-level bit lines of a super-set at a time.

13. The semiconductor memory device of claim 12, wherein the hierarchic column selection structure is structured to receive an address code that includes a first address code part and a second address code part, and the hierarchic column selection structure is structured to:
  use the first address code part for selecting the higher-level bit lines;
  use a second address code part for selecting at least one among the lower-level bit lines of a super-set;
  wherein the first and second address code parts have in common a third address code part, the control circuit being structured to use the third address code part for activating in a mutually exclusive manner the controlled clamping devices.

14. The semiconductor memory device of claim 13, wherein the lower-level bit line selection structure is adapted to use the second address code part for the joint selection of a target lower-level bit line among the lower-level bit lines of a super-set and of at least one lower-level bit line adjacent to said target lower-level bit line.

15. A method, comprising:
  selecting at least one of a plurality of bit lines of a semiconductor memory device including a memory matrix including a plurality of memory cells arranged in a plurality of rows and a plurality of columns; and a bit line selection structure, the bit lines each being associated with a respective column of said plurality of columns, wherein the memory device includes a hierarchic column selecting structure that includes:
    a first hierarchic level comprising said bit lines;
    a levels hierarchy of levels higher than the first, said hierarchy comprising at least a level higher than the first, said level higher than the first comprising respective bit lines each associated with a respective packet of bit lines belonging to the lower hierarchic level, said packets of bit lines being grouped in a first and a second collection of packets, the packets belonging to the first collection being alternated with the packets belonging to the second collection; and
  clamping at a desired voltage at least a pair of bit lines, capacitively coupled to the at least one selected bit line, wherein the clamping includes clamping bit lines belonging to packets adjacent to the packet containing the selected bit line, wherein said bit lines in the adjacent packets result connected to the corresponding higher-level bit line as a result of the selection of the selected bit line, so as to automatically clamp the bit lines belonging to the level higher than the first adjacent to the bit line belonging to the level higher than the first corresponding to the packet which contains the selected bit line.

16. The method of claim 15, wherein the bit lines are grouped in at least first and second groups, the bit lines belonging to the first group being alternated with the bit lines belonging to the second group,
  the method including clamping the bit lines belonging to the group not containing the selected bit line.

17. A semiconductor memory device, comprising:
  a plurality of memory cells arranged according to a plurality of rows and a plurality of columns;
  a plurality of global bit lines coupled to the columns;
  a bit line selector structured to select one of the bit lines;
  a plurality of clamping devices each coupled between a respective one of the bit lines and a reference voltage;
  a clamping controller structured to activate plural of the clamping devices that are coupled to non-selected bit lines adjacent to the selected bit line, thereby connecting the non-selected bit lines to the reference voltage; and
  a plurality of packets of local bit lines, each packet including a respective plurality of the local bit lines, each local bit line being associated with a respective column of the plurality of columns, and each global bit line being associated with a respective one of the packets of local bit lines.

18. The memory device of claim 17 wherein the bit line selector is a global bit line selector, the clamping devices are global clamping devices, and the clamping controller is a global clamping controller, the memory device further comprising:
  a local bit line selector structured to select one of the local bit lines;
  a plurality of local clamping devices each coupled between a respective one of the local bit lines and the reference voltage; and
  a local clamping controller structured to activate plural of the local clamping devices that are coupled to non-selected local bit lines adjacent to the selected local bit line, thereby connecting the non-selected local bit lines to the reference voltage.

19. The memory device of claim 17 wherein the clamping devices are clamping transistors controlled by the clamping controller.

20. A semiconductor memory device, comprising:
  a plurality of memory cells arranged according to a plurality of rows and a plurality of columns;
  a plurality of bit lines coupled to the columns;
  a bit line selector structured to select one of the bit lines;
  a plurality of clamping devices each coupled between a respective one of the bit lines and a reference voltage; and
  a clamping controller structured to activate plural of the clamping devices that are coupled to non-selected bit lines adjacent to the selected bit line, thereby connecting the non-selected bit lines to the reference voltage, wherein:
  the bit lines are grouped in at least first and second groups, the bit lines belonging to the first group being alternated with the bit lines belonging to the second group;
  the plurality of clamping devices is arranged according to two arrays, the bit lines belonging to the first group being connected to the clamping devices belonging to the first array, and the bit lines belonging to the second group being connected to the clamping devices belonging to the second array.

21. The memory device of claim 10, wherein the clamping controller is structured to activate the clamping devices belonging to the first array when the selected bit line belongs to the second group.

22. A semiconductor memory device, comprising:
a plurality of memory cells arranged according to a plurality of rows and a plurality of columns;
a plurality of bit lines coupled to the columns;
a bit line selector structured to select one of the bit lines;
a plurality of clamping devices each coupled between a respective one of the bit lines and a reference voltage; and
a clamping controller structured to activate plural of the clamping devices that are coupled to non-selected bit lines adjacent to the selected bit line, thereby connecting the non-selected bit lines to the reference voltage, wherein the bit line selector includes a hierarchic column selecting structure comprising:
a first hierarchic level comprising the plurality of bit lines;
a hierarchy of levels higher than the first hierarchic level, the levels hierarchy comprising a level higher than the first hierarchic level, the level higher than the first hierarchic level comprising respective higher level bit lines each one associated with a respective packet of bit lines belonging to the lower hierarchic level;
for each packet of bit lines, a respective plurality of selectors, each selector being coupled between a respective one of the bit lines and one of the higher level bit lines and having a control terminal; and
a plurality of selecting signals that are activated in a mutually exclusive manner, each selection signal being coupled to the control terminal of a respective one of the selectors for each packet of bit lines.

23. The memory device of claim 22, wherein:
the bit lines are grouped in at least first and second groups, the bit lines belonging to the first group being alternated with the bit lines belonging to the second group;
the plurality of clamping devices is arranged according to two arrays, the bit lines belonging to the first group being connected to the clamping devices belonging to the first array, and the bit lines belonging to the second group being connected to the clamping devices belonging to the second array.

24. The memory device of claim 23 wherein:
the packets of bit lines are grouped in at least a first and a second collections of packets, the packets belonging to the first collection being alternated with the packets belonging to the second collection;
a first one of the selection signals controls selectors that are coupled to bit lines belonging to the first collection of packets and the first group and bit lines belonging to the second collection of packets and the second group; and
a second one of the selection signals controls selectors that are coupled to bit lines belonging to the first collection of packets and second first group and bit lines belonging to the second collection of packets and the first group.

* * * * *